(12) United States Patent
Li

(10) Patent No.: US 7,654,310 B2
(45) Date of Patent: Feb. 2, 2010

(54) LOOP HEAT PIPE

(75) Inventor: Jia-Hao Li, Sindian (TW)

(73) Assignee: Jaffe Limited, Tortola (VG)

( * ) Notice: Subject to any disclaimer, the term of this patent is extended or adjusted under 35 U.S.C. 154(b) by 708 days.

(21) Appl. No.: 11/341,414

(22) Filed: Jan. 30, 2006

(65) Prior Publication Data

US 2007/0175613 A1 Aug. 2, 2007

(51) Int. Cl.
*H05K 7/20* (2006.01)

(52) U.S. Cl. ............... 165/104.33; 165/104.26; 361/700

(58) Field of Classification Search ......... 165/104.21, 165/104.33; 361/700
See application file for complete search history.

(56) References Cited

U.S. PATENT DOCUMENTS

| | | | | |
|---|---|---|---|---|
| 3,368,359 A | * | 2/1968 | English et al. | 62/3.64 |
| 4,393,663 A | * | 7/1983 | Grunes et al. | 62/119 |
| 5,998,863 A | * | 12/1999 | Kobayashi et al. | 257/715 |
| 6,269,865 B1 | * | 8/2001 | Huang | 165/104.26 |
| 6,840,304 B1 | * | 1/2005 | Kobayashi et al. | 165/11.1 |
| 7,231,961 B2 | * | 6/2007 | Alex et al. | 165/80.4 |
| 2002/0166655 A1 | * | 11/2002 | Sugito et al. | 165/104.21 |
| 2002/0195230 A1 | * | 12/2002 | Li | 165/104.33 |
| 2007/0006992 A1 | * | 1/2007 | Liu et al. | 165/104.26 |

FOREIGN PATENT DOCUMENTS

| | | | |
|---|---|---|---|
| JP | 07208812 A | * | 8/1995 |
| JP | 09148501 A | * | 6/1997 |
| JP | 2005233480 A | * | 9/2005 |
| TW | 92130196 | | 10/2003 |

* cited by examiner

*Primary Examiner*—Allen J Flanigan
(74) *Attorney, Agent, or Firm*—Chun-Ming Shih

(57) ABSTRACT

A loop heat pipe includes an evaporator and a closed loop. The evaporator includes an evaporator body made of a heat conductive material. The evaporator body has at least two retaining holes and at least a channel hole penetrating the retaining holes. In addition, the closed loop includes a first pipe body and at least a second pipe body. One end of the first and the second pipe bodies is a heat reception end, which are securely fastened to the two retaining holes of the evaporator. The other end of the first and the second pipe bodies is a heat reception end, thereby sequentially forming a circulating loop. Meanwhile, a flattened liquid seal region is formed between the heat reception end and the connection end of the first pipe body.

10 Claims, 2 Drawing Sheets

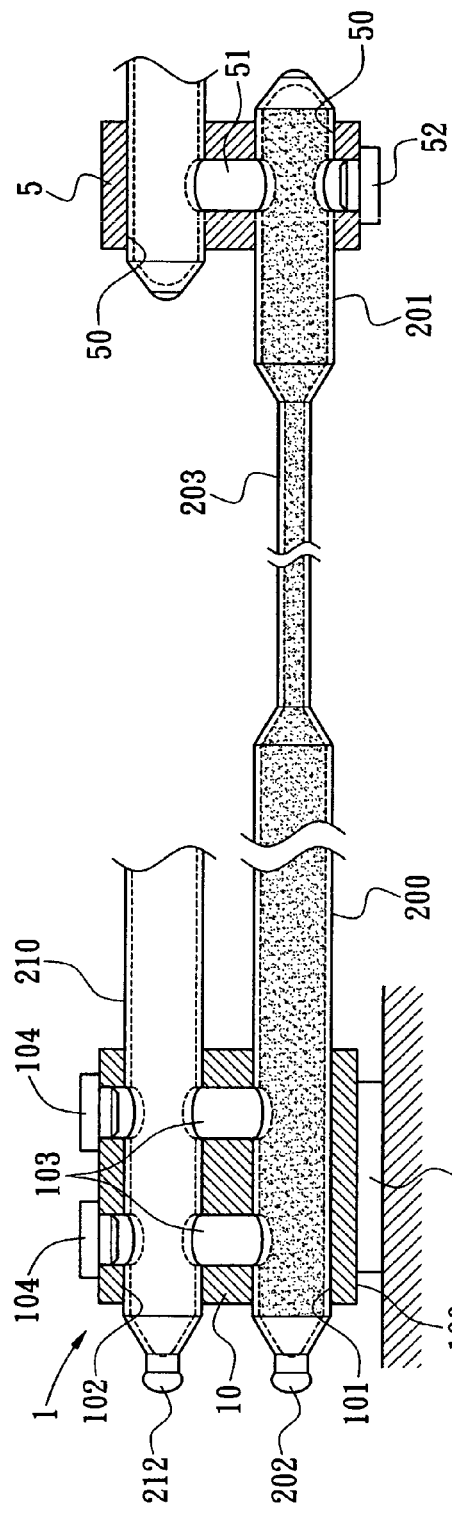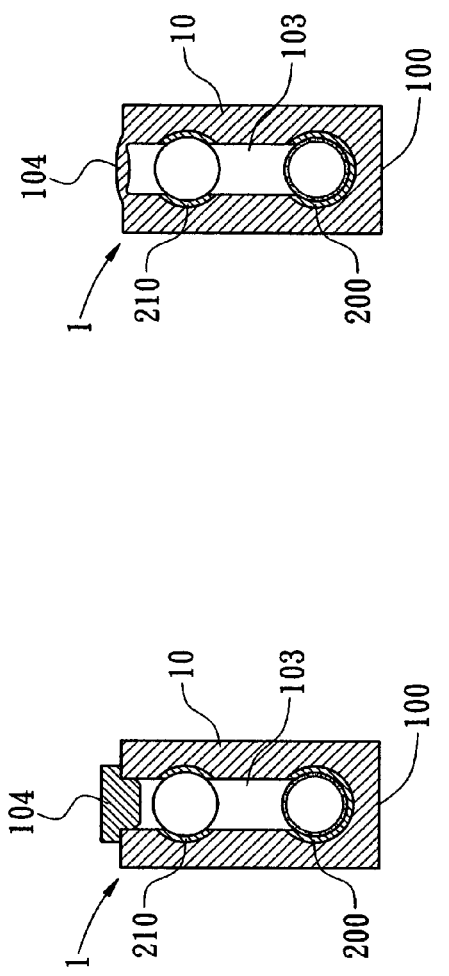

LOOP HEAT PIPE

BACKGROUND OF THE INVENTION

The present invention relates generally to a loop heat pipe, and more particularly to an evaporator of the loop heat pipe.

A loop heat pipe is a heat exchange system, wherein both the liquid and gas phase of the working fluid flow along the same direction. The working principle of the loop heat pipe is similar to that of the conventional heat pipe. However, the loop heat pipe does not comprise the drawback that the liquid phase of the working fluid flows along a direction opposite to that of the gas working fluid. Therefore, the performance of the loop heat pipe is much better than that of the conventional heat pipe.

One conventional loop heat pipe is disclosed in Taiwanese Patent Application No. 92130196, entitled "method for manufacturing evaporator of loop heat pipe." Although the primary subject matter disclosed in this application publication pertains to a method for manufacturing an evaporator of loop heat pipe, one can easily realize by viewing the appended figures that the evaporator of loop heat pipe is configured such that one side thereof is connected to an incoming pipe, while the other side thereof is connected to an outgoing pipe. After the pipes and the evaporator form a loop, it is very difficult to clean, evacuate or exhaust the internal part of the pipes. Therefore, the cleanness and the degree of vacuum of the pipes become uncontrollable, which will affect the performance of heat transfer. In addition, the evaporator of the application publication is composed of two external pipes, which requires an adhesion or a welding procedure to tightly connect the external pipes onto the evaporator. However, the adhesion or the welding procedure requires that the welding torch or the glue gun be surrounding the edge of the two external pipes. In this manner, the loop heat pipe will interfere the welding or the adhesion procedure.

On the other hand, one can use a detachable torch to prevent the interference of the loop heat pipe during the welding procedure using the torch. However, the detachable torch requires additional steps for detaching and assembling the torch, which will largely slow down the production speed. Moreover, one can also use a soldering procedure to replace the welding procedure. However, the melted soldering material can flow into the pipe, which will be absorbed by the capillary structure, thereby clogging the capillary structure.

Accordingly, the inventor of the present invention realized the drawbacks in the conventional art, and developed the present invention that can overcome the drawbacks described above.

BRIEF SUMMARY OF THE INVENTION

The present invention is to provide a loop heat pipe, which includes an evaporator and a closed loop. The connection of the evaporator and the closed loop can ease the operation for cleaning, evacuating or exhausting the loop heat pipe before sealing. Furthermore, the convenient connection procedure of the evaporator and the closed loop will enhance the performance of the sealing operation.

The loop heat pipe includes an evaporator and a closed loop. The evaporator includes an evaporator body made of a heat conductive material. The evaporator body has at least two retaining holes and at least a channel hole penetrating the retaining holes. In addition, the closed loop includes a first pipe body and at least a second pipe body. One end of the first and the second pipe bodies is a heat reception end, which are securely fastened to the two retaining holes of the evaporator. The other end of the first and the second pipe bodies is a heat reception end, thereby sequentially forming a circulating loop. Meanwhile, a flattened liquid seal region is formed between the heat reception end and the connection end of the first pipe body.

BRIEF DESCRIPTION OF THE DRAWINGS

FIG. 2 is a partially enlarged view of the first pipe body of the loop heat pipe of the present invention.

FIG. 3 illustrates the evaporator of the loop heat pipe of the present invention in another viewing angle.

FIG. 4 illustrates the evaporator, in accordance with another embodiment of the present invention.

DETAILED DESCRIPTION OF THE INVENTION

Figure 1:
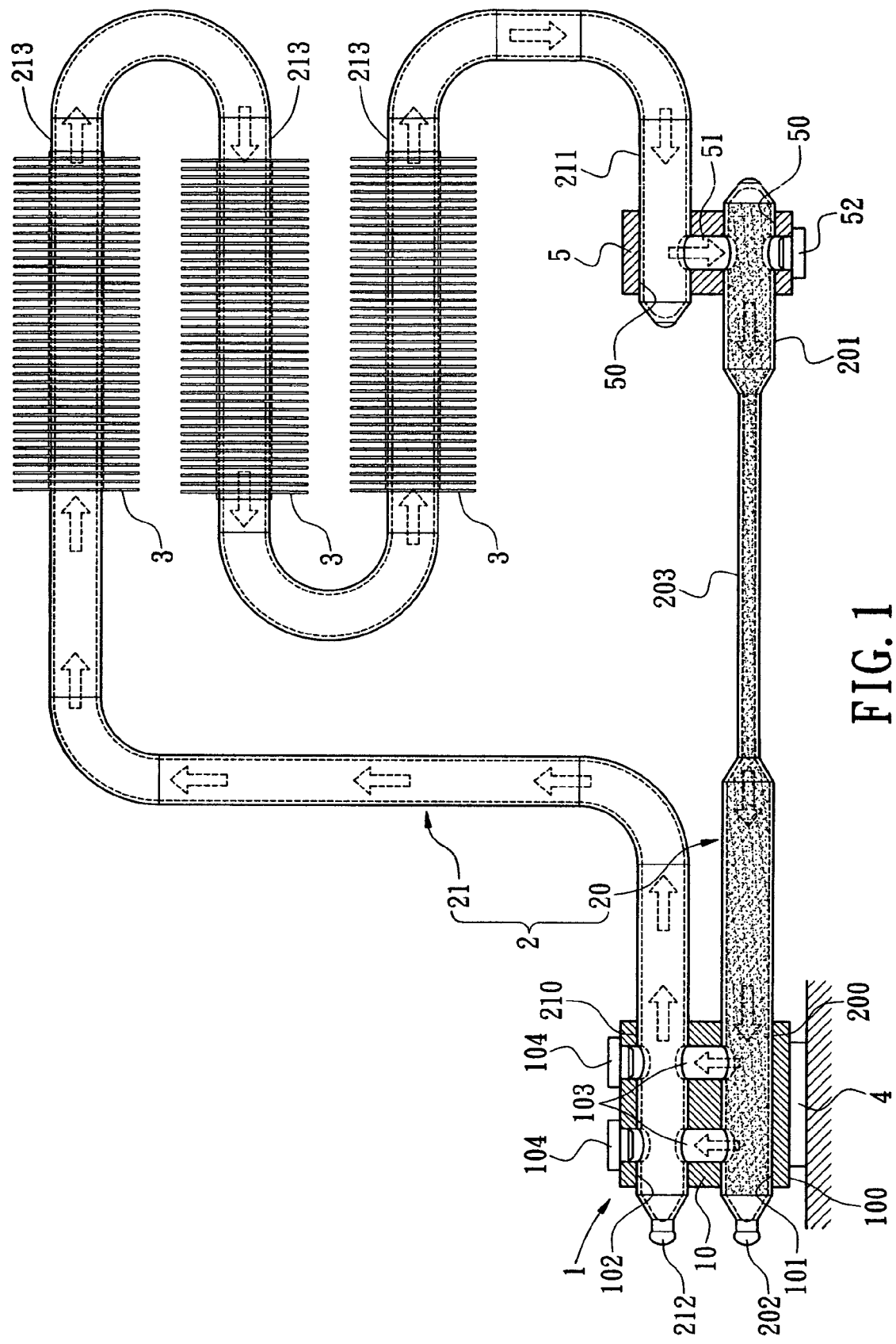
FIG. 1 is a sectional view illustrating a loop heat pipe of the present invention.

In order to better understanding the features and technical contents of the present invention, the present invention is hereinafter described in detail by incorporating with the accompanying drawings. However, the accompanying drawings are only for the convenience of illustration and description, no limitation is intended thereto.

Referring to FIG. 1, a loop heat pipe in accordance with the first embodiment of the present invention is illustrated. As shown, the loop heat pipe includes an evaporator 1 and a sealed pipe 2.

The evaporator 1 is the portion that the loop heat pipe absorbs heat. The evaporator 1 includes a evaporator body 10 made of a heat conductive material, e.g. aluminum or copper. Therefore, the evaporator body 10 is substantially a heat spreader, which includes a contact surface 100 provided for contacting with a heat source 4. The heat source 4 is a heat generating electronic device. In one embodiment, the heat source 4 refers to a central processing unit. In addition, at least two retaining holes 101, 102 and at least a channel hole 103 penetrating the retaining holes 101, 102 are formed on the evaporator body 10.

The sealed pipe 2 is composed of a first pipe body 20 and at least a second pipe body 21 sequentially connected with each other. Each pipe body 20, 21 includes a capillary structure adhered to the inner wall thereof. In this particular embodiment, both the first pipe body 20 and the second pipe body 21 include a heat reception end 200, 210. The two heat reception ends 200, 210 penetrates the two retaining holes 101, 102 of the evaporator body 10, respectively. Further, the heat reception ends 200, 210 of the first pipe body 20 and the second pipe body 21 are securely fastened to the evaporator body 10 by soldering or adhering a heat conductive soldering material or glue thereon. Later, the top portion of the evaporator body 10 penetrates the channel hole 103. The other ends of the first and the second pipe bodies 20, 21 includes mutually adjacent connection ends 201, 211. The two connection ends 201, 211 are connected through a connection piece. The connection piece 5 includes two connection holes 50 for the connection ends 201, 211 of the first and the second pipe bodies 20, 21 to penetrate therethrough, and a channel hole 51 penetrating the two connection holes 50. Referring to FIG. 2 and FIG. 3, the channel holes 103, 51 are blind holes for the evaporator body 10 and the connection piece, which is used only to penetrate the two heat reception ends 200, 201 or the two connection ends 201, 211, so as to combine the sealed pipe 2 and the evaporator body 10. The sealed pipe 2 can form a closed loop via the channel holes 103, 51 to form a circulation loop, as shown in FIG. 1.

Further, seal portions 104, 52 are formed on the channel holes 103, 51 at the top portion of the evaporator body 10 and the connection piece 5, respectively. The seal portion 104, 52 can be a plug, as shown in FIG. 3, or a soldered structure formed by a soldering procedure (as shown in FIG. 4), so as to effectively seal the channel holes 103, 51 within the evaporator body 10 and the connection piece 5.

When the sealed pipe 2 and the channel holes 103, 51 form a circulation loop, at least one of the two retaining holes 101, 102 of the evaporator body 10 is a through hole penetrating the evaporator body 10. In this particular embodiment, both the two retaining holes 101, 102 are through holes. In this manner, at least one of the heat reception ends of the first and the second pipe bodies 20, 21 of the sealed pipe 2 can protrude the evaporator 1 from the retaining holes 101, 102. The heat reception ends 200, 210 that protrudes the evaporator 1 are the seal ends of the first and the second pipe body 20, 21. Before the sealed ends 200, 210 are closed, one can perform the operations for cleaning, evacuating or exhausting the sealed pipe 2 and the channel holes 103. Once such operations are completed, the sealed ends 200, 210 are then closed via shrinking, pressing and soldering the ends, thereby forming sealed structures 202, 212.

In addition, a flattened liquid seal region 203 is formed between the heat reception end 200 and the connection end 201 of the first pipe body. The liquid seal region 203 allows the condensed working fluid to fill therein, thereby forming a liquid seal. Consequently, a larger area of evaporation region is formed, which will reduce the thermal resistance and increase the heat transfer rate. Thus, a loop heat pipe of good heat transfer property is obtained.

Furthermore, one or more condensation regions 213 are formed on the second pipe body 21. One can further dispose a plurality of cooling fins 3 on the condensation regions 213. On the other hand, the connection piece 5 is similar to the evaporator 1 described above. However, the connection piece 5 is not limited to the being made of heat conductive materials, because the primary function of the connection piece 5 is to communicably connect each pipe body 20, 21, not contacting the heat source 4.

Consequently, a loop heat pipe of the present invention is obtained.

In summary, the loop heat pipe of the present invention indeed satisfies the patentability requirements of the patent law, a grant of letters patent therefor is thus respectfully requested.

Since, any person having ordinary skill in the art may readily find various equivalent alterations or modifications in light of the features as disclosed above, it is appreciated that the scope of the present invention is defined in the following claims. Therefore, all such equivalent alterations or modifications without departing from the subject matter as set forth in the following claims is considered within the spirit and scope of the present invention.

What is claimed is:

1. A loop heat pipe, comprising:
   an evaporator having an evaporator body made of a heat conductive material, the evaporator body comprising at least two retaining holes and at least a channel hole penetrating the retaining holes; and
   a closed loop comprising a first pipe body and at least a second pipe body, one end of the first and the second pipe bodies being a heat reception end, which are securely fastened to the two retaining holes of the evaporator, the other end of the first and the second pipe bodies being a heat reception end, thereby sequentially forming a circulating loop; wherein
   a flattened liquid seal region is formed between the heat reception end and the connection end of the first pipe body,
   wherein the connection ends of the first and the second pipe body are connected via a connection piece, the connection piece comprising two connection holes formed thereon for the two connection ends to insert therein, and a channel hole that penetrates the connection holes.

2. The loop heat pipe as recited in claim 1, wherein the evaporator body is made of aluminum or copper.

3. The loop heat pipe as recited in claim 1, wherein the evaporator body comprises a contact surface for contacting a heat source.

4. The loop heat pipe as recited in claim 1, wherein at least one of the two retaining holes of the evaporator is a through hole that penetrates through the two sides of the evaporator body, and at least one of heat reception ends of the first and the second pipe bodies protrudes the evaporator from the retaining hole.

5. The loop heat pipe as recited in claim 4, a sealed structure is formed on the heat reception end that protrudes the evaporator body.

6. The loop heat pipe as recited in claim 1, wherein a seal portion is formed on the top portion of the evaporator body at the channel hole of the evaporator.

7. The loop heat pipe as recited in claim 6, wherein the seal portion comprises a plug, or a soldered structure formed by a soldering procedure.

8. The loop heat pipe as recited in claim 1, wherein a seal portion is formed on the top portion of the channel hole of the connection piece.

9. The loop heat pipe as recited in claim 8, wherein the seal portion comprises a plug, or a soldered structure formed by a soldering procedure.

10. The loop heat pipe as recited in claim 1, the second pipe body comprises at least a condensation region, which includes a plurality of cooling fins disposed thereon.

* * * * *